United States Patent
Park et al.

(10) Patent No.: US 8,458,554 B2
(45) Date of Patent: * Jun. 4, 2013

(54) DEVICE FOR PROCESSING STREAMS AND METHOD THEREOF

(75) Inventors: Chan-sub Park, Incheon (KR); Hae-joo Jeong, Seoul (KR); June-hee Lee, Seongnam-si (KR); Joon-soo Kim, Seoul (KR); Jung-pil Yu, Suwon-si (KR); Eui-jun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 369 days.

This patent is subject to a terminal disclaimer.

(21) Appl. No.: 12/670,775

(22) PCT Filed: Jul. 25, 2008

(86) PCT No.: PCT/KR2008/004374
§ 371 (c)(1),
(2), (4) Date: Jan. 26, 2010

(87) PCT Pub. No.: WO2009/014403
PCT Pub. Date: Jan. 29, 2009

(65) Prior Publication Data
US 2010/0192045 A1   Jul. 29, 2010

Related U.S. Application Data

(60) Provisional application No. 60/952,109, filed on Jul. 26, 2007.

(30) Foreign Application Priority Data

Dec. 11, 2007   (KR) .................. 10-2007-0128263

(51) Int. Cl.
*H03M 13/00*   (2006.01)
(52) U.S. Cl.
USPC .......................................... 714/752; 714/786
(58) Field of Classification Search
USPC ................................ 714/746, 752, 784, 786
See application file for complete search history.

(56) References Cited

U.S. PATENT DOCUMENTS

| | | | |
|---|---|---|---|
| 8,102,920 B2* | 1/2012 | Suh et al. .................. | 375/240.27 |
| 2004/0064782 A1* | 4/2004 | Lerner et al. ................... | 714/800 |
| 2008/0059866 A1* | 3/2008 | Song et al. ..................... | 714/776 |
| 2010/0195709 A1* | 8/2010 | Park et al. ..................... | 375/229 |
| 2010/0199147 A1* | 8/2010 | Park et al. ..................... | 714/758 |

FOREIGN PATENT DOCUMENTS

| | | |
|---|---|---|
| EP | 0 681 373 B1 | 2/2003 |
| KR | 10-2002-0029429 A | 4/2002 |
| KR | 10-2004-0031179 A | 4/2004 |
| WO | 2006/085251 A2 | 8/2006 |

* cited by examiner

*Primary Examiner* — Yolanda L Wilson
(74) *Attorney, Agent, or Firm* — Sughrue Mion, PLLC (57) ABSTRACT

A device for processing streams is disclosed. The device includes a stream arranging unit which stacks and rearranges a stream, and a dummy inserting unit which inserts a dummy into the rearranged stream. The device may further include a convolutional interleaver which interleaves the stream with a dummy or an RS encoder and a CRC encoder.

34 Claims, 6 Drawing Sheets

DEVICE FOR PROCESSING STREAMS AND METHOD THEREOF

CROSS-REFERENCE TO RELATED PATENT APPLICATION

This application is a National Stage application under 35 U.S.C. §371 of PCT/KR2008/004374 filed on Jul. 25, 2008, which claims priority from U.S. Provisional Application No. 60/952,109 filed Jul. 26, 2007, and Korean Patent Application No. 10-2007-0128263 filed Dec. 11, 2007, all of which are incorporated herein in their entireties by reference.

BACKGROUND

1. Field

Apparatuses and methods consistent with the present inventive concept relate to processing streams by interleaving the streams with a dummy.

2. The Related Art

With the development of electronic and communication technologies, digital technologies have been introduced into the field of broadcasting systems, and diverse standards for digital broadcasting have been published. Specifically, these standards include the Advanced Television Systems Committee (ATSC) Vestigial Sideband (VSB) standard that is used as a digital terrestrial broadcasting standard in North America, and the Digital Video Broadcasting-Terrestrial (DVB-T) standard that is used as a digital terrestrial broadcasting standard in Europe.

The ATSC VSB transmission method used in North America is based on the National Television System Committee (NTSC) frequency band, and is advantageous in that a transmitter and a receiver can be implemented easily and economically. Such an ATSC VSB transmission method uses a single carrier amplitude modulation vestigial side band (VSB), and is able to transmit high quality video, audio, and auxiliary data at a single 6 MHz bandwidth.

Diverse standards for digital broadcasting have been proposed so as to provide improved digital broadcasting services.

Accordingly, there is a need for technologies for more effectively and stably processing streams.

SUMMARY

The present inventive concept addresses the above problem. According to aspects of the present inventive concept, there is provided a device for processing streams capable of processing streams efficiently and stably, a method thereof, and a digital broadcasting receiver receiving the processed streams.

According to one exemplary embodiment, there is provided a device for processing streams, the device comprising: a stream rearranging unit which stacks and rearranges a stream; and a dummy inserting unit which inserts a dummy into the rearranged stream.

The interleaver may be a convolutional interleaver.

The stream rearranging unit may vertically stack the stream according to a number of packets that are preset for each unit and rearrange the stream by perpendicularly rotating the stacked stream for each unit.

The stream rearranging unit may divide respective packets for each unit into blocks having a preset size and perform the perpendicular rotation on the respective packets in each block.

The dummy inserting unit may insert a dummy corresponding to a size of a memory in the interleaver into the stream rotated in each block.

The device for processing streams may further comprise a dummy removing unit which removes the dummy from the stream output from the interleaver; and a burst generating unit which collects the stream, from which the dummy is removed, in burst units.

According to another exemplary embodiment, the stream rearranging unit may rearrange the stream so as to be horizontally arranged according to a preset first size unit, and vertically stacking the stream.

The device for processing streams may further comprise a Reed-Solomon (RS) encoder which adds an RS parity vertically to an end portion of the stream; and a Cyclic Redundancy Check (CRC) encoder which adds a CRC value horizontally to an end portion of the stream to which the RS parity is added.

The dummy inserting unit may divide the stacked stream into transmission bursts, each burst having a preset second size, and add a dummy into the stream.

The dummy may be inserted into only a burst of the transmission bursts which does not satisfy the preset second size.

According to an exemplary embodiment, there is provided a method of processing streams, the method comprising stacking and rearranging a stream, and inserting a dummy into the rearranged stream.

The interleaving the stream may comprise using a convolutional interleaver.

The stacking and rearranging the stream may comprise vertically stacking the stream according to a number of packets that are preset for each unit; and rearranging the stream by perpendicularly rotating the stacked stream for each unit.

The rearranging the stream by perpendicularly rotating the stacked packets for each unit may comprise dividing respective packets for each unit into blocks having a preset size and performing the perpendicular rotation on the respective packets in each block.

The inserting the dummy may comprise inserting a dummy corresponding to a size of a memory of the convolutional interleaver into the stream rotated in each block.

The method of processing streams may further comprise removing the dummy from the interleaved stream; and collecting the stream, from which the dummy has been removed, in burst units.

According to another exemplary embodiment, the rearranging the stream may comprise horizontally arranging the stream according to a preset first size unit and vertically stacking and rearranging the stream.

The method of processing streams may further comprise performing RS encoding which adds an RS parity vertically to an end portion of the stream; and performing CRC encoding which adds a CRC value horizontally to an end portion of the stream to which the RS parity is added.

The inserting the dummy may comprise dividing the stacked stream into transmission bursts, each burst having a preset second size; and adding a dummy into the stream.

The dummy may be inserted into only a burst of the transmission bursts which does not satisfy the preset second size.

According to an exemplary embodiment of the present invention, there is provided a digital broadcasting receiver comprising a tuner which receives a stream; a demodulator which demodulates the received stream; an equalizer which equalizes the demodulated stream; and a deinterleaver which deinterleaves the equalized stream, wherein the stream is stacked and rearranged in a preset unit, and is processed by inserting a dummy, at a digital broadcasting transmitter which transmits the stream.

The stream may be convolutionally interleaved and the dummy is removed therefrom, at the digital broadcasting transmitter.

The digital broadcasting receiver may further comprise a dummy removing unit which removes the dummy inserted into the stream, wherein the stream is block-interleaved and the dummy is inserted thereinto, at the digital broadcasting transmitter.

With a device for processing streams, a method thereof, and a digital broadcasting receiver according to the diverse forms of exemplary embodiments, streams can be transmitted/received efficiently and stably.

DETAILED DESCRIPTION OF EXEMPLARY EMBODIMENTS

Hereinafter, exemplary embodiments will be described with reference to the accompanying drawings.

Figure 1:
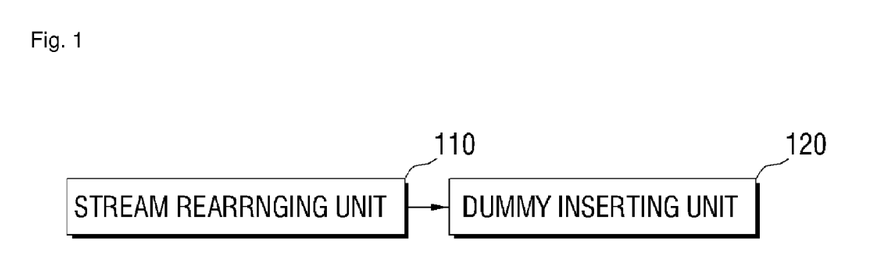
FIG. 1 is a block diagram showing a configuration of a device of processing streams according to an exemplary embodiment.

FIG. 1 is a block diagram showing a configuration of a device of processing streams according to an exemplary embodiment. Referring to FIG. 1, the device of processing streams includes a stream rearranging unit 110 and a dummy inserting unit 120.

The stream rearranging unit 110 stacks and rearranges an input stream. Rearrangement methods may vary according to various exemplary embodiment.

The dummy inserting unit 120 inserts a dummy into the stream rearranged by the stream rearranging unit 110. The dummy means data which are inserted to have the rearranged streams be distinguished by a preset processing unit or transmission unit. The dummy may use optional data with no meaning, for example, a preset bit value such as 0 bits, or a preset byte value. The dummy may also use meaningful data. For example, when there are diverse forms of data to be transmitted supplementarily, for example, data such as supplementary reference signals or supplementary channel information, corresponding data may be used as a dummy.

The stream rearranging unit 110 may stack the stream in a preset unit. For example, the stream rearranging unit 110 may horizontally arrange a part of the stream in packet or segment and then arrange another part of the stream in the next packet or segment on the following line of the stream to vertically stack the stream.

An interleaving unit may be added to a rear end of the dummy inserting unit 120 of FIG. 1.

Figure 2:
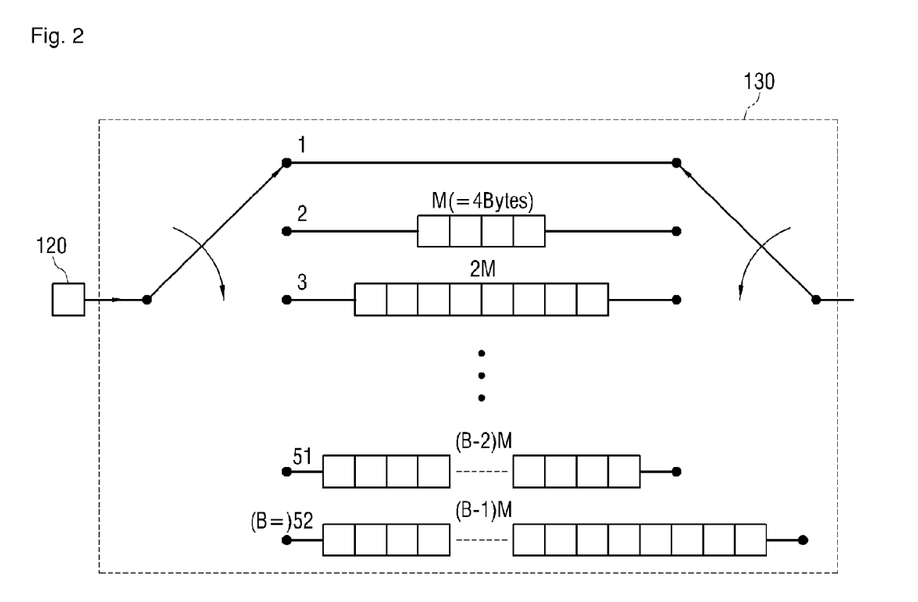
FIG. 2 is a schematic block diagram showing the device of processing streams of FIG. 1 to which a convolutional interleaver is added, according to an exemplary embodiment.

FIG. 2 is a schematic block diagram showing the device of processing streams of FIG. 1 to which an interleaving unit 130 is added.

As shown in FIG. 2, the interleaving unit 130 is implemented as a convolutional interleaver, and may be provided on a rear end of the dummy inserting unit 120. More specifically, the interleaving unit 130 may be implemented as a convolutional byte interleaver that processes the stream in bytes. The interleaving unit 130 of FIG. 2 may be implemented to have different branch numbers and memory sizes according to the sort of transceiver used.

When the interleaving unit 130 is implemented as a convolutional byte interleaver, the interleaving unit 130 includes a plurality of shift registers having different lengths. In other words, shift registers having sizes M, 2M . . . (B−2)M, (B−I)M are arranged in sequence. The interleaving unit 130 selects the respective shift registers in sequence to make the interleaving intervals different.

Referring to FIG. 2, the stream input to the interleaving unit 130 are divided into bytes and stored in the plurality of shift registers in sequence, and are then output again in sequence. Interleaving in bytes is performed in this manner.

For example, when the input stream is divided into a plurality of fields, each of which comprises 312 data segments or packets, the interleaving unit 130 may be implemented to operate using blocks of 52 data segments or packets.

FIGS. 3 to 6 are schematic block diagrams explaining a stream processing operation of the device of processing streams as shown in FIGS. 1 and 2 when a convolutional interleaver is used as the interleaving unit 130.

Figure 3:
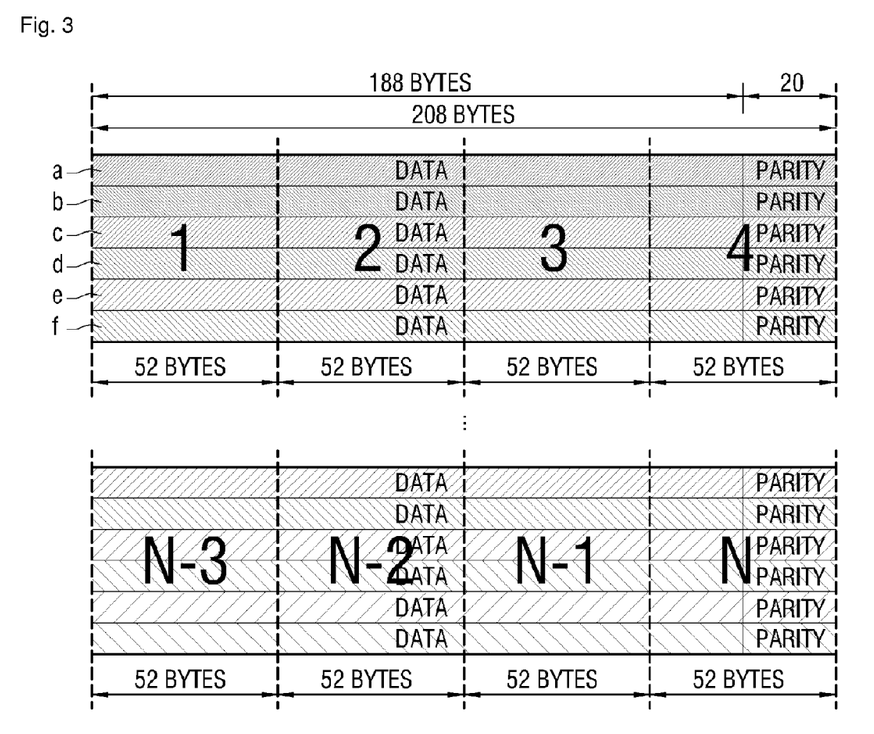
FIGS. 3 to 6 are schematic block diagrams explaining stream processing operation of a device of processing streams using a convolutional interleaver, according to exemplary embodiments.

Referring to FIG. 3, a stream rearranging unit 110 stacks a stream sequentially in blocks of preset numbers of packets. For example, the stream rearranging unit 110 may stack the stream in blocks, each block having six packets. Each packet may have a form including 188 bytes of data and a 20-byte parity. The stream rearranging unit 110 may rotate perpendicularly and rearrange the respective vertically stacked stream units.

In this case, as shown in FIG. 3, the stream rearranging unit 110 may divide horizontally the plurality of stacked packets into a plurality of blocks again. In this case, six packets may be divided into four blocks. When a single packet consists of a total of 208 bytes as shown in FIG. 3, the stream arranging unit 110 may divide each stack of 6 packets into four blocks, each packet of each block having 52 bytes. As shown in FIG. 3, the plurality of packets may thus be divided into N blocks. For convenience of explanation, the blocks divided by the stream rearranging unit 110 are represented as 1, 2, 3, 4 . . . N−3, N−2, N−I and N.

Figure 4:
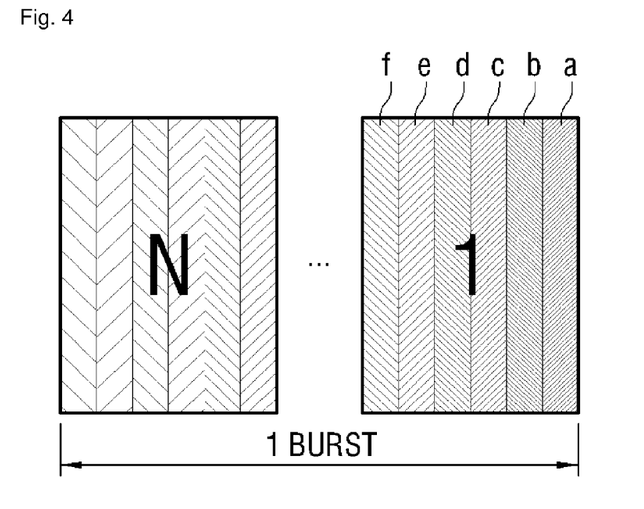

FIG. 4 shows a state of rotated blocks, after a stream has been divided into blocks by a stream rearranging unit 110. The stream rearranging unit 110 may rotate each of N blocks by 90 degrees in a clockwise direction. Six packets a, b, c, d, e and f are thereby arranged vertically as shown in FIG. 4. The stream rearranging unit 110 may output the rotated blocks sequentially as shown in FIG. 4.

FIG. 4 shows that N blocks rotated by the stream rearranging unit 110 are output sequentially from a first block to an N-th block, but the N blocks may be output randomly, not sequentially. When N blocks are output randomly by the stream rearranging unit 110, it may be expected that data are much more mixed after being interleaved by the interleaving unit 130.

Figure 5:
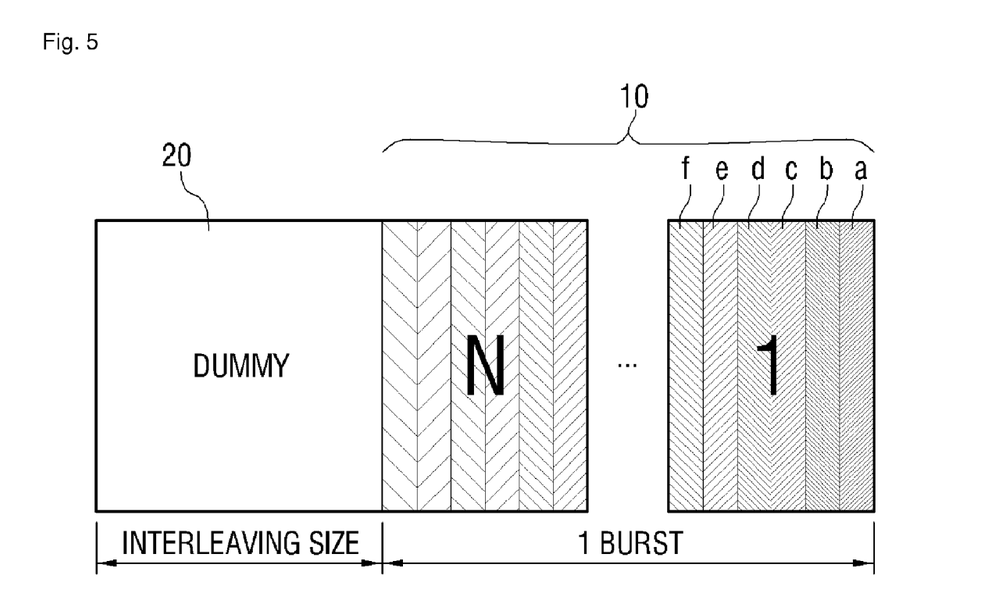

FIG. 5 is a schematic block diagram of a stream into which dummy 20 is inserted by a dummy inserting unit 120. Referring to FIG. 5, the dummy inserting unit 120 may insert the dummy 20 into the data part 10. In this case, the dummy inserting unit 120 may insert the dummy 20 of an appropriate size into the data part 10 taking into consideration the memory size of the interleaving unit 130, that is, the interleaving size.

In other words, since the interleaving unit 130 includes a plurality of shift memories, the dummy 20 corresponding to the plurality of shift memories should be inserted in order that the data part 10 is stored in the shift memories to be output. As the dummy 20 is thus input to the interleaving unit 130, the data part 10 is shifted normally and output.

Figure 6:
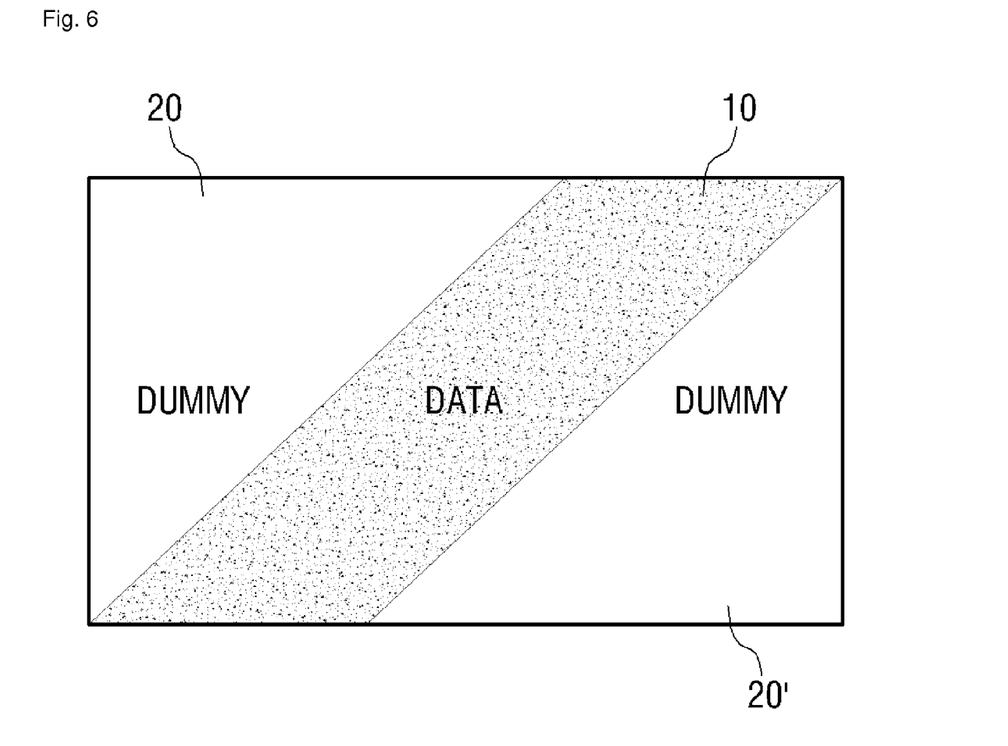

FIG. 6 is a schematic block diagram of a stream after being interleaved by the interleaving unit 130. Data are mixed by the interleaving operation of the interleaving unit 130. In this case, the dummy 20 of FIG. 5 is output after the data part 10 is output, so the dummy 20 is positioned to the left of a data part 10 in FIG. 6. A dummy 20' positioned to the right of the data part 10 may become a dummy for previous data.

As described above, the interleaving is performed after the stream is rearranged by the stream rearranging unit 110, and it is possible to secure sufficiently wide interleaving intervals. In other words, when a convolutional interleaver of FIG. 2 is used, an interleaving interval between the same data is only 4 bytes or 8 bytes if a memory path such as M or 2M is selected. The interleaving performance is thus deteriorated.

However, as shown in FIGS. 3 to 5, if the stream is rearranged and interleaved after adding the dummy 20 in the stream rearranging unit 110, it is possible to secure sufficiently wide interleaving intervals between the same data. The interleaving performance can thereby be improved.

Meanwhile, after the stream including the dummy 20 is interleaved as shown in FIG. 6, the dummy may be removed from the stream for transmission.

Figure 7:
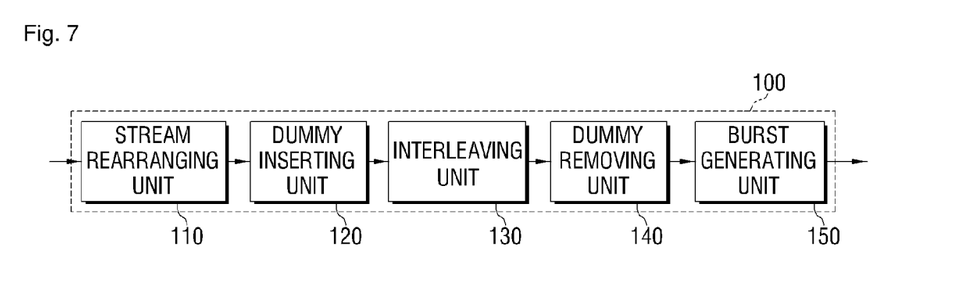
FIG. 7 is a block diagram showing one example of a detailed configuration of the device of processing streams of FIG. 1.

FIG. 7 is a block diagram showing an example of a device for processing streams 100 including the interleaving unit 130 as shown in FIG. 2, further including a dummy removing unit 140 and a burst generating unit 150.

Referring to FIG. 7, the interleaving unit 130 of the device for processing streams 100 may output the stream of FIG. 6 to the dummy removing unit 140.

The dummy removing unit 140 removes the dummy 20 from the stream, and the burst generating unit 150 collects, in a burst unit, the stream from which the dummy 20 has been removed by the dummy removing unit 140. Assuming that a unit of the stream input into the device for processing streams 100 is referred to as one burst, the burst generating unit 150 may collect the stream corresponding to one burst and output the stream in a state that the dummy 20 has been added to the stream for processing by the interleaving unit 130 and then removed therefrom.

Figure 8:
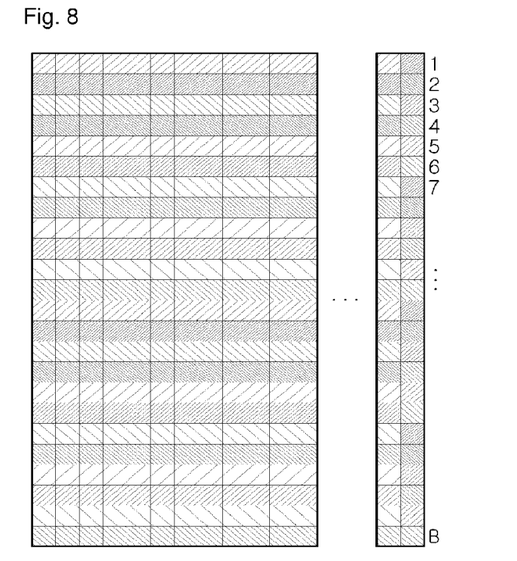
FIG. 8 is a schematic block diagram showing one example of a configuration of streams from which the dummy has been removed.

FIG. 8 is a schematic block diagram of a stream that is collected in a burst unit, after the stream has been interleaved by the interleaving unit 130 and the dummy 20 has been removed therefrom by the dummy removing unit 140.

In other words, the stream of FIG. 8 may be a final state of the stream output by the device for processing streams 100. Referring to FIG. 8, the stream has a vertical length corresponding to the branch number B of a convolutional interleaver such as the interleaving unit 130.

In this case, referring to the right-most vertical line of FIG. 8, it may be known that respective packets a, b, c, d, e, f . . . are interleaved and arranged in predetermined units. For example, "a" packet is interleaved in the manner that it is divided one by one into every six section. If the stream is rearranged, and then interleaved after adding the dummy 20 as described above, it is possible to prevent the interleaving intervals of the stream from being narrow in the related art interleaving method. Consequently, a stable stream transmission can be made, the possibility of packets being discarded and retransmitted is reduced, making it possible to provide an efficient digital broadcasting service.

Figure 9:
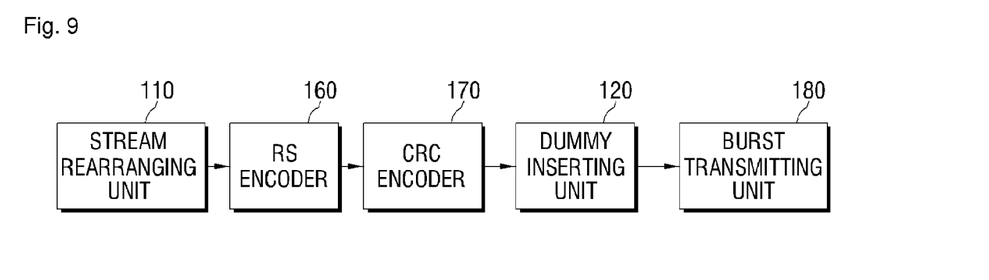
FIG. 9 is a block diagram showing a configuration of a device of processing streams according to another exemplary embodiment.

FIG. 9 is a schematic block diagram of a configuration of a device for processing streams according to another exemplary embodiment. Referring to FIG. 9, the device for processing streams further comprises an RS encoder 160, a cyclic redundancy check (CRC) encoder 170 and a burst transmitting unit 180, in addition to the stream rearranging unit 110 and the dummy inserting unit 120 as shown in FIG. 7.

The stream rearranging unit 110 rearranges a stream by arranging the stream horizontally according to a preset first size unit and stacking the stream vertically. The form of the rearranged stream is shown in FIG. 10.

Figure 10:
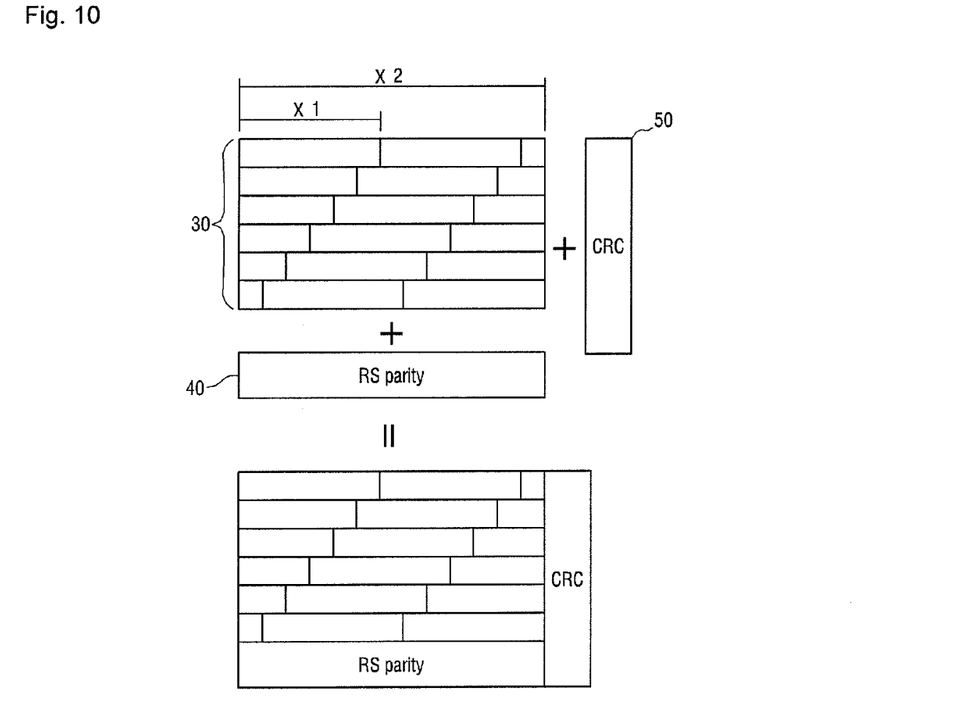
FIGS. 10 and 11 are schematic block diagrams explaining the stream processing operation of a device of processing streams of FIG. 9, according to exemplary embodiments.

Referring to FIG. 10, a stream 30 is arranged horizontally according to a first size x2, and is stacked vertically to form a plurality of lines, according to an exemplary embodiment. In this exemplary embodiment, the stream may be divided into a plurality of sections, and more than one section may be arranged in a row on one line having the first size x2. If, however, the more than one section exceeds the first size x2, a later portion of the last section may be arranged on a subsequent line. Specifically, a plurality of sections of the stream, each section having a second size x1, may be disposed within one line, x1 may be diversely set according to the exemplary embodiment. For example, x1 may be set as 187 bytes.

When the stream 30 is rearranged as shown in FIG. 10, the RS encoder 160 adds an RS parity 40 to an end portion of the stream 30 in a vertical direction. In other words, the RS encoder 160 calculates the RS parity 40 vertically with respect to the stream 30 and adds the calculated RS parity 40 into the stream 30 vertically.

The CRC encoder 170 adds CRC values 50 to the stream 30 to which the RS parity 40 is added in a horizontal direction. The CRC values 50 include both CRC values for the stream 30 and CRC values for the RS parity 40.

Consequently, the stream processed by the RS encoder 160 and the CRC encoder 170 may have the form shown at the bottom of FIG. 10.

The stream constituted as described above is transmitted using a method shown in FIG. 11, according to an exemplary embodiment.

Figure 11:
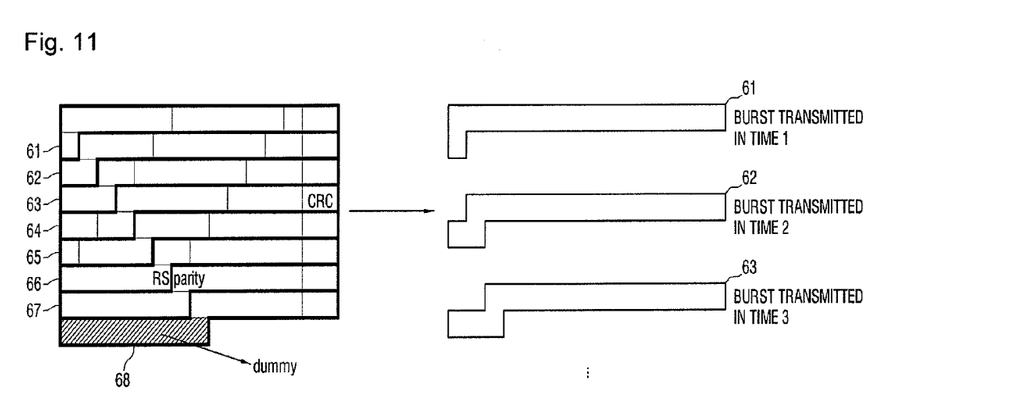

FIG. 11 is a schematic block diagram explaining a method of processing a stream. Referring to FIG. 11, the burst transmitting unit 180 as shown FIG. 9 transmits a stream supplied from the dummy inserting unit 120 in burst units 61, 62, 63, 64, 65, 66, 67 and 68. Here, the size of a single burst may be set to be larger than the horizontal size of the stream further including the CRC value 50 part. In this case, a single burst of the stream transmitted at a given time includes a portion of the stream disposed on a subsequent line.

In other words, as shown in the right side of FIG. 11, transmission is made in bursts. In the case of the last transmission burst 68 of FIG. 11, the burst 68 fails to completely make up the size of a single burst.

The dummy inserting unit 120 inserts a dummy into the stream so that an empty space within the burst can be filled thereby. In other words, the dummy inserting unit 120 divides the stream into transmission bursts of a preset second size, and, if a burst does not satisfy the preset second size of a single transmission burst, the dummy inserting unit 120 adds the dummy to the stream so as to match a single transmission burst size. Data transmission can thereby be performed in bursts by the burst transmitting unit 180.

As shown in FIGS. 10 and 11, transmission is performed horizontally in a state that the RS parity 40 is calculated vertically and added to the stream, so block interleaving is performed. In other words, the stream rearranged with the RS parity 40 and CRC values 50 added are stored in the plurality of memories in the form shown at the bottom of FIG. 10, and is then output in bursts horizontally as shown in FIG. 11, making it possible to obtain the effect of block interleaving.

As described above, the device for processing streams may be implemented using diverse methods.

The devices for processing streams having the diverse configurations described above may be used for a digital broadcasting transmitter. A stream processed by the above described devices may be an existing normal data stream, a supplementary data stream having enhanced robustness, or a stream including known data for improving equalization performance.

In this case, the device for processing streams may further comprise diverse constituents such as a MUX unit constituting a stream, a data processing unit allowing a supplementary data stream to have enhanced robustness, a randomizer performing randomization, an RS encoder performing RS encoding, a trellis encoder, a sync multiplexer adding a field sync or a segment sync to the stream, a modulator performing modulation, a known data inserting unit inserting known data to the stream, and the like. These constituents are disposed in diverse forms, so diverse exemplary embodiments may be constructed.

Figure 12:
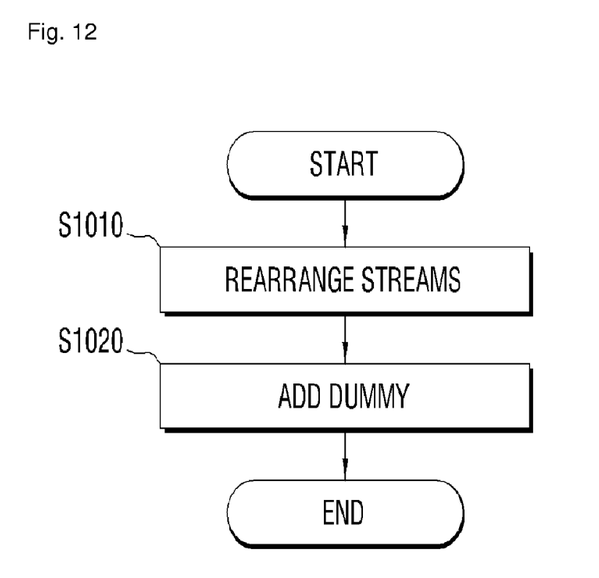
FIG. 12 is a flowchart explaining a method of processing streams according to an exemplary embodiment.

FIG. 12 is a flowchart explaining a method of processing streams according to an exemplary embodiment. Referring to FIG. 12, if a stream is input, the stream is rearranged in operation S1010. The rearranged forms are changed according to the configuration of an interleaver such as the interleaving unit 130 as shown in FIG. 2 or FIG. 7. In other words, when the interleaving unit 130 is a convolutional interleaver, the stream is stacked and then divided into blocks of a predetermined size, so the stream may be arranged by rotating the blocks perpendicularly.

When the device for processing streams is constructed as shown in FIG. 9 and block interleaving is thus performed, the dummy may be added only to some bursts.

The stacked and rearranged stream may be output such that the blocks constituting the stream are output sequentially or randomly.

The dummy is then added to the output stream in operation S 1020.

As described above, the dummy fills internal memories of the interleaving unit 130 with specific values so that interleaving is normally performed by the interleaving unit 130 to output the streams.

When the stream is rearranged and the dummy is inserted thereinto as shown in FIGS. 3 to 5, convolutional interleaving may be performed after adding the dummy. Owing to the interleaving, the respective packets within the stream are rearranged at diverse intervals. In this case, an operation to remove the dummy may be further included after interleaving the stream. After removing the dummy, an operation to collect and output the stream in burst units may also further be included. These operations have been explained in detail in the above description, so duplicated explanation thereof will be omitted.

When the device for processing streams is implemented in the form of FIG. 9, a separate interleaving operation may not be necessary after adding the dummy. In other words, in the case of the device for processing streams of FIG. 9, a stream is stacked and rearranged, and RS encoding and CRC encoding are performed thereon. In this state, an output is made horizontally to generate block interleaving. When a burst is not completely filled with data, RS parity, and CRC values during the process, the burst is filled with a dummy.

Figure 13:
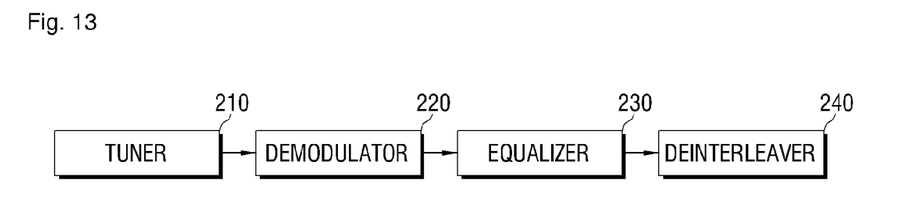
FIGS. 13 and 14 are block diagrams showing a configuration of a digital broadcasting receiver according to diverse exemplary embodiments.

FIG. 13 is a block diagram showing a configuration of a digital broadcasting receiver according to an exemplary embodiment. The digital broadcasting receiver of FIG. 13 may receive streams processed by the device for processing streams having a configuration as shown in FIG. 1, 7 or 9 or a digital broadcasting transmitter having the same. More specifically, the digital broadcasting receiver may be implemented as a portable display device such as a cellular phone, a laptop computer, a navigation device or an electronic notebook, or a display device such as a TV or a set-top box.

Referring to FIG. 13, the digital broadcasting receiver includes a tuner 210, a demodulator 220, an equalizer 230, and a deinterleaver 240.

The tuner 210 selects a channel and receives a stream.

The demodulator 220 demodulates the stream received by the tuner 210, and the equalizer 230 equalizes the demodulated stream.

The deinterleaver 240 deinterleaves the equalized stream to reconstitute the stream to its original state.

The stream received by the digital broadcasting receiver of FIG. 13 may be a stream that is convolutionally interleaved on the side of a transmitting terminal and from which a dummy is then removed. In other words, a stream in the shape as shown in FIG. 8 may be received and processed.

In the case of the stream processed in the manner shown in FIGS. 10 and 11, the stream may be a stream from which a dummy has not been removed. When the stream from which the dummy has not been removed is received, the digital broadcasting receiver may further include a configuration for removing the dummy.

Figure 14:
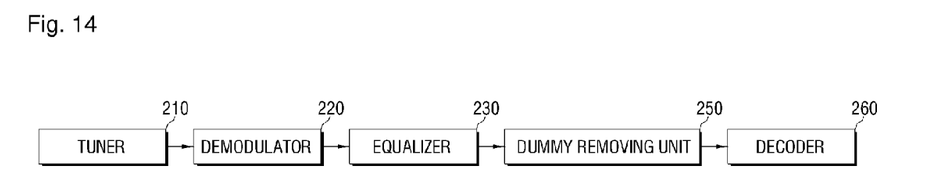

FIG. 14 is a block diagram showing a configuration of a digital broadcasting receiver receiving a stream including a dummy according to another exemplary embodiment. The digital broadcasting receiver of FIG. 14 includes a tuner 210, a demodulator 220, an equalizer 230, a dummy removing unit 250, and a decoder 260.

The dummy removing unit 250 removes a dummy from a stream processed as shown in FIGS. 10 and 11 and thus transmitted without the dummy being removed. In other words, the digital broadcasting receiver of FIG. 14 receives and processes the stream block-interleaved on the side of the digital broadcasting transmitter and including the dummy.

In this case, the dummy removing unit 250 checks the size of the data region of the stream using information included in the stream or information provided through a separate channel, so a part exceeding the size of the data region may be understood to be a dummy.

The decoder 260 decodes the stream from which the dummy has been removed and restores the stream. In this case, the decoder 260 stacks the streams sequentially and then processes them perpendicularly to the direction of stacking, thereby making it possible to obtain the block interleaving effects.

Although not shown in the digital broadcasting receiver in FIG. 13 or FIG. 14, the digital broadcasting receiver may further include diverse constituents, such as a trellis encoder, an RS decoder, a derandomizer, a demultiplexer, and the like.

The stream received by the digital broadcasting receiver of FIG. 13 or FIG. 14 may include a normal data stream, a supplementary data stream processed to have enhanced robustness, known data, or the like.

Although a few exemplary embodiments have been shown and described, it would be appreciated by those skilled in the art that changes may be made without departing from the principles and spirit of the present inventive concept, the scope of which is defined in the claims and their equivalents.

The invention claimed is:

1. A transmitter for processing streams, the device comprising:
   a stream rearranging unit which stacks and rearranges a stream;
   a dummy inserting unit which inserts a dummy into the rearranged stream; and
   an interleaver which convolutionally interleaves the stream to which the dummy is inserted,
   wherein the stream rearranging unit vertically stacks the stream according to a number of packets that are preset for each unit and rearranges the stream by perpendicularly rotating the stacked stream for each unit.

2. The transmitter of claim 1, wherein the stream rearranging unit divides respective packets for each unit into blocks having a preset size and performs the perpendicular rotation on the respective packets in each block.

3. The transmitter of claim 2, wherein the dummy inserting unit inserts a dummy corresponding to a size of a memory in the interleaver into the stream rotated in each block.

4. The transmitter of claim 2, further comprising:
   a dummy removing unit which removes the dummy from the stream output from the interleaver; and
   a burst generating unit which collects the stream, from which the dummy is removed, in burst units.

5. The device of claim 2, wherein the stream rearranging unit rearranges the stream such that the blocks, each block comprising the perpendicularly rotated respective packets, are disposed adjacent to one another and output to the dummy inserting unit sequentially in the adjacently disposed order, or randomly.

6. The transmitter of claim 1, wherein the stream rearranging unit rearranges the stream by horizontally arranging the stream according to a preset first size unit and vertically stacking the stream.

7. The transmitter of claim 6, further comprising:
   a Reed-Solomon (RS) encoder which adds an RS parity vertically to an end portion of the stream; and
   a Cyclic Redundancy Check (CRC) encoder which adds a CRC value horizontally to an end portion of the stream to which the RS parity is added.

8. The transmitter of claim 7, wherein the dummy inserting unit divides the stacked stream into transmission bursts, each burst having a preset second size, and adds a dummy into the stream.

9. The transmitter of claim 8, wherein the dummy is inserted into a burst of the transmission bursts which does not satisfy the preset second size.

10. The device of claim 6, wherein the stream comprises a plurality of sections,
    wherein the stream rearranging unit horizontally arranges the stream according to a first size, and stacks vertically to form a plurality of lines, each line having the first size,
    wherein, for the horizontal arranging of the stream, the stream rearranging unit arranges more than one section of the stream in a row on one line of the plurality of lines, and
    wherein, if the one line exceeds the first size, a portion of the last section on the one line, by which the one line exceeds the first size, is arranged on a subsequent line of the plurality of lines.

11. The device of claim 6, wherein the stream comprises a plurality of sections,
    wherein the rearranging the stream comprises horizontally arranging the stream according to a first size, and stacking vertically to form a plurality of lines, each line having the first size,
    wherein, for the horizontal arranging the stream, at least one line of the plurality of lines comprising more than one section of the stream in a row on the at least one line, and
    wherein, if the at least one line exceeds the first size, a portion of the last section on the at least one line, by which the at least one line exceeds the first size, is arranged on a subsequent line of the plurality of lines.

12. A method of processing streams, the method comprising:
    stacking and rearranging a stream;
    inserting a dummy into the rearranged stream; and
    interleaving the stream to which the dummy is inserted using a convolutional interleaver,
    wherein the stacking and rearranging the stream comprises:
    vertically stacking the stream according to a number of packets that are preset for each unit; and
    rearranging the stream by perpendicularly rotating the stacked stream for each unit.

13. The method of claim 12, wherein the rearranging the stream by perpendicularly rotating the stacked packets for each unit comprises dividing respective packets for each unit into blocks having a preset size and performing the perpendicular rotation on the respective packets in each block.

14. The method of claim 13, wherein the inserting the dummy comprises inserting a dummy corresponding to a size of a memory of the convolutional interleaver into the stream rotated in each block.

15. The method of claim 13, further comprising:
    removing the dummy from the interleaved stream; and
    collecting the stream, from which the dummy has been removed, in burst units.

16. The method of claim 13, wherein the rearranging the stream comprises rearranging the stream such that the blocks, each block comprising the perpendicularly rotated respective packets, are disposed adjacent to one another and output to the dummy inserting unit sequentially in the adjacently disposed order, or randomly.

17. The method of claim 12, wherein the rearranging the stream comprises horizontally arranging the stream according to a preset first size unit and vertically stacking and rearranging the stream.

18. The method of claim 12, further comprising:
    performing Reed-Solomon (RS) encoding which adds an RS parity vertically to an end portion of the stream; and
    performing Cyclic Redundancy Check (CRC) encoding which adds a CRC value horizontally to an end portion of the stream to which the RS parity is added.

19. The method of claim 18, wherein the inserting the dummy comprises:
    dividing the stacked stream into transmission bursts, each burst having a preset second size; and
    adding a dummy into the stream.

20. The method of claim 18, wherein the dummy is inserted into a burst of the transmission bursts which does not satisfy the preset second size.

21. A digital broadcasting receiver, comprising:
   a tuner which receives a stream;
   a demodulator which demodulates the received stream;
   an equalizer which equalizes the demodulated stream; and
   a deinterleaver which deinterleaves the equalized stream,
   wherein the stream is stacked and rearranged in a preset unit, and is processed by inserting a dummy, at a digital broadcasting transmitter which transmits the stream,
   wherein the digital broadcasting receiver further comprises a dummy removing unit which removes the dummy inserted into the stream, and
   wherein the stream is block-interleaved and the dummy is inserted thereinto, at the digital broadcasting transmitter.

22. The digital broadcasting receiver of claim 21, wherein the stream is convolutionally interleaved and the dummy is removed therefrom, at the digital broadcasting transmitter.

23. A digital broadcast transmitter, comprising:
   a stream rearranging unit which arranges a stream according to a preset arrangement unit so as to stack the stream in a direction perpendicular to an arrangement direction;
   a Reed-Solomon (RS) encoder which encodes the stream in the direction perpendicular to the arrangement direction and adds an RS parity to the stream; and
   a cyclic redundancy check (CRC) encoder which adds a CRC value to the stream, to which the RS parity is added, in the arrangement direction.

24. The digital broadcast transmitter according to claim 23, wherein the stream rearranging unit arranges the stream so that a plurality of streams divided according to a preset processing unit are arranged in a single arrangement unit.

25. The digital broadcast transmitter according to claim 23, wherein the stream rearranging unit arranges the stream so that a single stream divided according to a preset processing unit is arranged according to plurality of arrangement units.

26. The digital broadcast transmitter according to claim 23, further comprising:
   a dummy inserting unit which constitutes a stream of a burst unit by adding a dummy to the stream; and
   a burst transmission unit which transmits the stream of the burst unit.

27. The digital broadcast transmitter according to claim 23, wherein the stream comprises an additional data stream which is processed to be robust against an error.

28. The digital broadcast transmitter according to claim 23, further comprising:
   a multiplexer which constitutes a transport stream by multiplexing the stream, to which the RS parity and the CRC value are added, with a normal data stream;
   a trellis encoder which performs trellis-encoding of the transport stream;
   a sync multiplexer which adds a sync to the trellis-encoded transport stream; and
   a modulator which modulates the transport stream to which the sync is added.

29. A method for processing a stream in a digital broadcast transmitting apparatus, the method comprising:
   arranging a stream according to a preset arrangement unit so as to stack the stream in a direction perpendicular to an arrangement direction;
   encoding the stream in the direction perpendicular to the arrangement direction and adding a Reed-Solomon (RS) parity to the stream; and
   adding a Cyclic Redundancy Check (CRC) value to the stream, to which the RS parity is added, in the arrangement direction.

30. The method according to claim 29, wherein in the arranging the stream, the stream is arranged so that a plurality of streams divided according to a preset processing unit are arranged in a single arrangement unit.

31. The method according to claim 29, wherein in the arranging the stream, the stream is arranged so that a single stream divided according to a preset processing unit is arranged according to plurality of arrangement units.

32. The method according to claim 29, further comprising:
   constituting a stream of a burst unit by adding a dummy to the stream; and
   transmitting the stream of the burst unit.

33. The method according to claim 29, wherein the stream comprises an additional data stream which is processed to be robust against an error.

34. The method according to claim 29, further comprising:
   constituting a transport stream by multiplexing the stream, to which the RS parity and the CRC value are added, with a normal data stream;
   performing trellis-encoding of the transport stream;
   adding a sync to the trellis-encoded transport stream; and
   modulating the transport stream to which the sync is added.

* * * * *